(12) United States Patent
Furuya et al.

(10) Patent No.: US 6,753,587 B2
(45) Date of Patent: Jun. 22, 2004

(54) SEMICONDUCTOR PHOTO DETECTING DEVICE AND ITS MANUFACTURING METHOD

(75) Inventors: Akira Furuya, Yamanashi (JP); Tatsunori Shirai, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/026,451

(22) Filed: Dec. 27, 2001

(65) Prior Publication Data

US 2002/0084505 A1 Jul. 4, 2002

(30) Foreign Application Priority Data

Dec. 28, 2000 (JP) ........................................ 2000-402075

(51) Int. Cl.⁷ .......................................... H01L 31/105
(52) U.S. Cl. ...................... 257/466; 257/436; 257/447; 257/458; 257/460
(58) Field of Search ................................ 257/434, 436, 257/458, 460, 447, 466

(56) References Cited

U.S. PATENT DOCUMENTS 5,218,223 A    6/1993  Spaeth et al. ............... 257/436
5,661,590 A    8/1997  Almogy et al. ............. 359/248
5,932,114 A  * 8/1999  Makiuchi ...................... 216/24

FOREIGN PATENT DOCUMENTS

| JP | 11-135823 | 5/1999 |
| JP | 11-307806 | 11/1999 |
| JP | 2000-183390 | 6/2000 |

OTHER PUBLICATIONS

Ng. Complete Guide to Semiconductor Devices, 1995, McGraw Hill., pp. 446–451.*

English machine translation of JP 11-135,823.*

* cited by examiner

*Primary Examiner*—B. William Baumeister
(74) *Attorney, Agent, or Firm*—Westerman, Hattori, Daniels & Adrian, LLP

(57) ABSTRACT

A high response speed semiconductor photo detecting device having a thin photo absorption layer which avoids an optical efficiency loss. The semiconductor photo detecting devices are formed on a semiconductor substrate having an inclined cleavage face to a principal plane of the substrate. An incoming photo signal is input to the cleavage face perpendicularly.

8 Claims, 6 Drawing Sheets

SEMICONDUCTOR PHOTO DETECTING DEVICE AND ITS MANUFACTURING METHOD

BACKGROUND OF THE INVENTION

1. Field of the Invention

The present invention generally relates to semiconductor devices, and more particularly, to semiconductor photo detecting devices for an application of optical fiber communication systems and optical information processing devices, and manufacturing method of the device.

2. Description of the Related Art

Semiconductor photo detecting devices convert a photo signal into an electric signal, and are essential components in optical fiber communication systems. A recent increase in traffic through optical fiber communication systems, accompanied by an increase in communication speed, demands a further increase in a response speed of semiconductor photo detecting devices.

PIN photo diodes are widely used as conventional high speed semiconductor photo detecting devices. A PIN photo diode includes a photo absorption layer where an incoming photo signal generates photo-excited carriers thereof. The carriers are output as a photo-electric current through a reverse biased p-n junction. The PIN photo diode is capable of high speed response.

A response speed of the PIN photo diode is, however, restricted by a parasitic capacitance of the p-n junction. Various configurations claiming to reduce the parasitic capacitance are proposed successfully.

As configuration improvements reduce the parasitic capacitance of the PIN photo diode, a carrier movement time in which photo-excited carriers move through the photo absorption layer is drawing attention as another restriction in response speed. By reducing a thickness of the photo absorption layer of the PIN photo diode, the carrier movement time can be reduced, but more incoming photo signal passes through the layer. Since the incoming light is not absorbed sufficiently, a less efficiency of photo detection becomes another problem.

To avoid this dilemma, a PIN photo diode which receives a photo signal at an inclined incidental angle to the slim photo absorption layer to reduce the carrier movement time and, at the same time, to increase the photo detection efficiency, is proposed.

Figure 1:
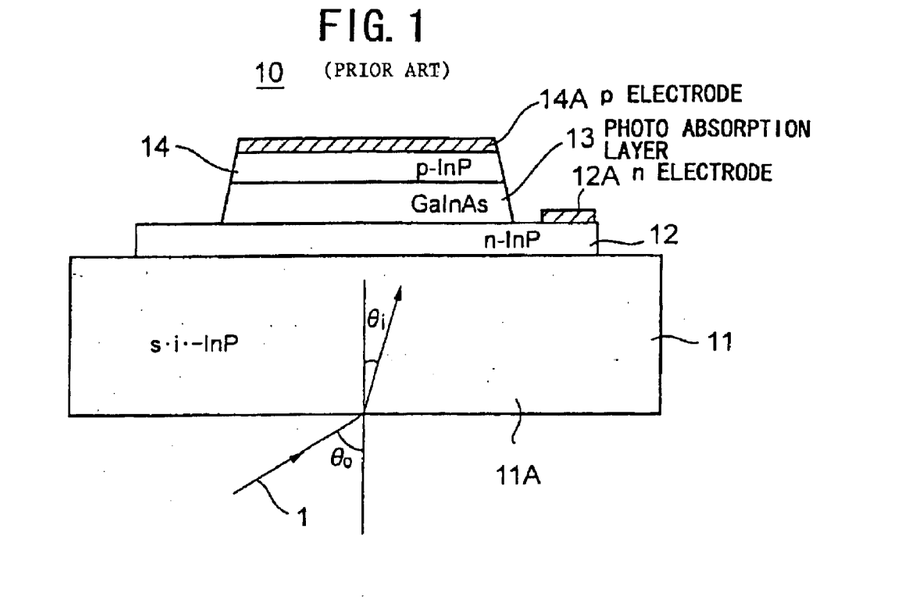
FIG. 1 is a drawing showing a configuration of a PIN photo diode of a prior art.

FIG. 1 shows a configuration of a high speed PIN photo diode 10 using a conventional technology.

As shown in FIG. 1, the PIN photo diode 10 is formed on a semi-insulating InP substrate 11, and includes an n-type InP buffer layer 12 grown by epitaxial growth technique on the InP substrate, a non-doped or n⁻-type InGaAs photo absorption layer 13 grown by epitaxial growth technique on the buffer layer 12, a p-type InP cap layer 14 grown by epitaxial growth technique on the photo absorption layer 13. An n-type ohmic electrode 12A is formed on the n-type InP buffer layer 12, and p-type ohmic electrode 14A is formed on the p-type InP cap layer.

In case of the configuration shown in FIG. 1, the n-type InP buffer layer 12 forms a pattern of a limited area on the InP substrate 11, and the photo absorption layer 13 and p-type InP cap layer 14 also form a mesa structure of a limited area on the n-type InP buffer layer 12, and a parasitic capacitance of the configuration is consequently minimal. Further, in case of the PIN photo diode, an incoming photo signal 1 comes to a bottom face 11A of the InP substrate 11 at an inclined incidental angle of $\theta_o$, and is refracted at a refraction angle $\theta_i$. The photo signal passes through the photo absorption layer 13 at an inclined angle.

In case of a photo diode that requires an incoming photo signal passing through the substrate bottom face 11A at an inclined angle, even if the incoming photo signal comes to the substrate bottom face 11A at a big incidental angle $\theta_o$, the photo signal passes through the photo absorption layer 13 substantially perpendicularly due to a very high refraction rate, about 3.0, of the InP substrate 11. An optical path in the absorption layer 13 is not long enough.

Figure 2:
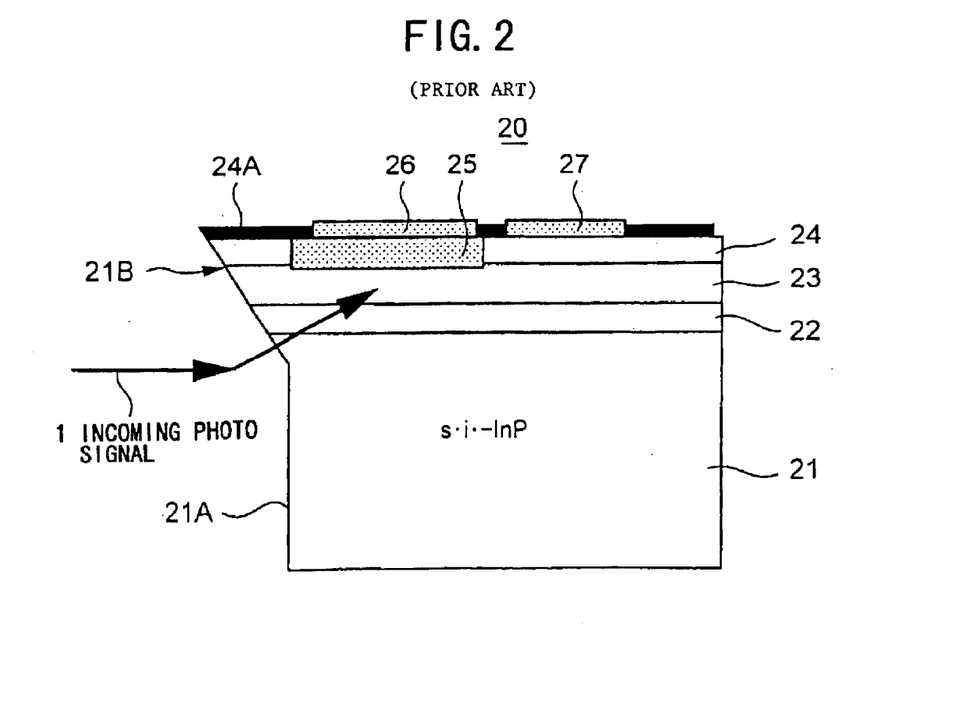
FIG. 2 is a drawing showing another configuration of a PIN photo diode of a prior art.

FIG. 2 shows another configuration of a high speed PIN photo diode 20 using a conventional technique, which is described in a Japanese Patent Laid-open Application No. 11-135823.

As shown in FIG. 2, the PIN photo diode 20 is formed on a semi-insulating InP substrate 21, and includes an n-type InP buffer layer 22 grown by epitaxial growth technique on the InP substrate 21, an n⁻-type InGaAs photo absorption layer 23 grown by epitaxial growth technique on the InP buffer layer 22, a n-type InP cap layer 24 grown by epitaxial growth technique on the photo absorption layer 23. A doped p-type diffusion region 25 is formed in the InP cap layer 24 and a portion of the InGaAs photo absorption layer 23 thereof.

A p-type ohmic electrode 26 connected to the p-type diffusion region 25 is formed on the InP cap layer 24, and n-type ohmic electrode 27 is formed on an n-type region outside the p-type diffusion region 25. An exposed surface of the InP cap layer 24 is covered by a passivation film 24A such as SiN.

In case of the PIN photo diode 20 shown in FIG. 2, a portion of semiconductor layers 22–24 including the substrate 21 is removed by etching from a side. The PIN photo diode 20 has a side face 21A of the substrate 21 and a slope 21B connected to the side face 21A and cutting the semiconductor layers 22–24 at an inclined angle. If a photo signal 1 comes to the slope 21B in parallel to the substrate 21, the photo signal 1 is refracted at the slope 21B toward the photo absorption layer 23.

A configuration similar to the PIN photo diode 20 shown in FIG. 2 is described in a Japanese Patent Laid-open Application No. 11-307806.

Figure 3:
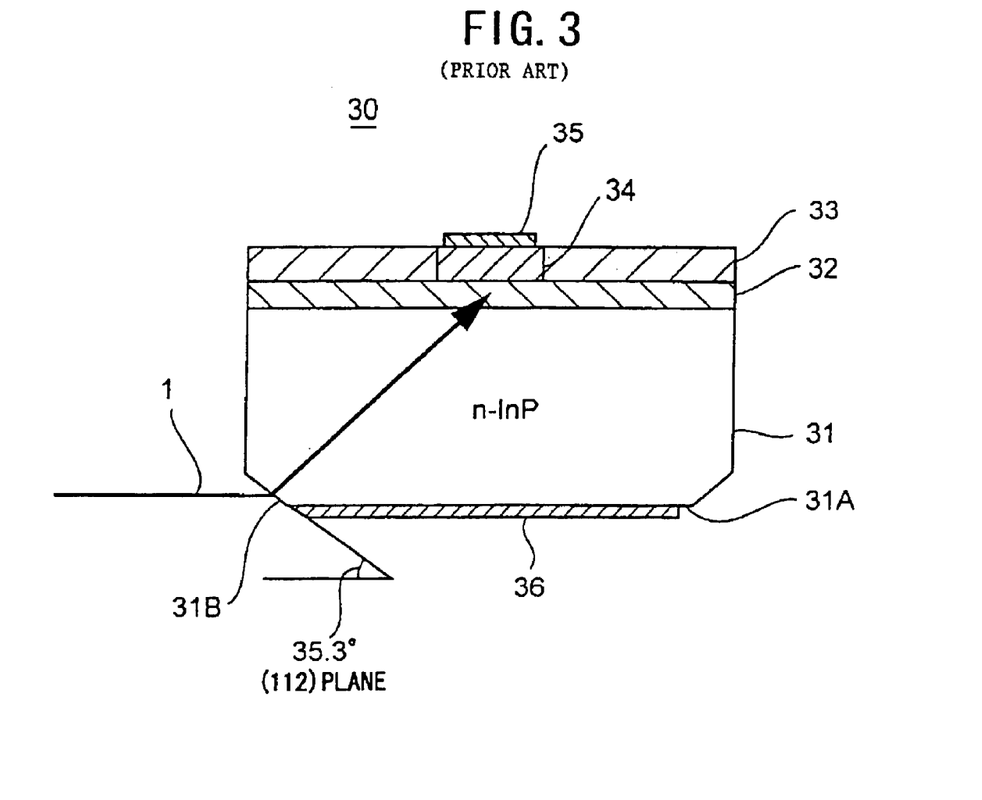
FIG. 3 is a drawing showing yet another configuration of a PIN photo diode of a prior art.

FIG. 3 shows a configuration of a PIN photo diode 30 described in the Japanese Patent Laid-open Application No. 11-307806. In FIG. 3, portions described previously are referred by the same numerals as before.

As shown in FIG. 3, the PIN photo diode 30 is formed on a n-type InP substrate 31, and includes an n⁻-type InGaAs photo absorption layer 32 grown by epitaxial growth technique on the substrate 31, and an n-type InP cap layer 33 grown by epitaxial growth technique on the photo absorption layer 32. A p-type doped diffusion region 34 is formed in the InP cap layer 33 and a portion of the InGaAs photo absorption layer thereof. A p-type ohmic electrode 35 is formed on the p-type diffusion region 34, and n-type ohmic electrode 36 is formed on a bottom principal plane 31A of the InP substrate 31.

In case of the PIN photo diode 30 shown in FIG. 3, a slope 31B is formed at the bottom of the InP substrate 31. A photo signal 1 coming in parallel to the bottom face of the substrate 31 is refracted toward the photo absorption layer 32.

It should be noted that a direction of an incoming photo signal can be changed not only by refraction but also by a reflection.

Figure 4:
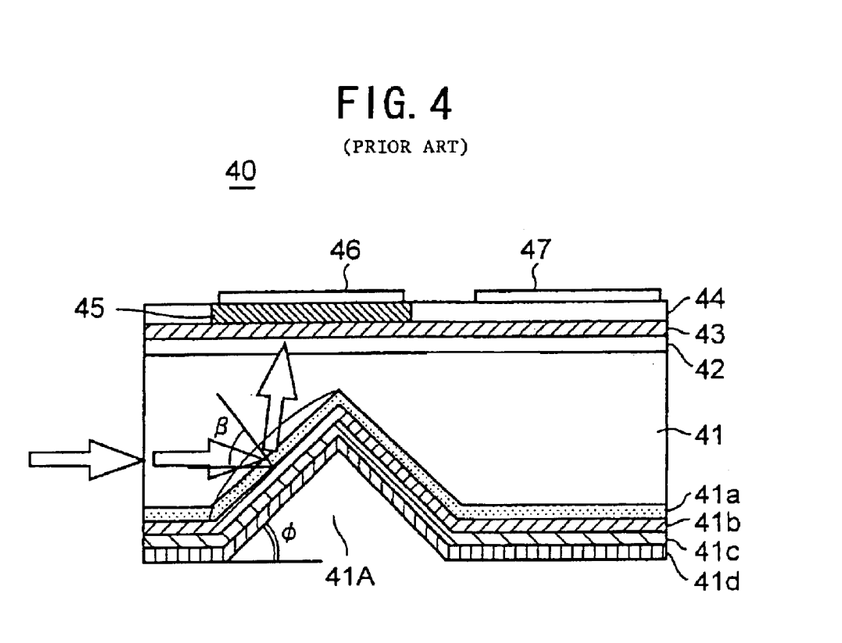
FIG. 4 is a drawing showing yet another configuration of a PIN photo diode of a prior art.

FIG. 4 shows a configuration of a PIN photo diode 40 described in a Japanese Patent Laid-open Application No. 2000-183390. This configuration utilizes a reflection of an incoming photo signal.

As shown in FIG. 4, the PIN photo diode 40 is formed on a semi-insulating InP substrate 41, and includes an n-type InP buffer layer 42 grown by epitaxial growth technique on the InP substrate 41, an n⁻-type InGaAs photo absorption layer 43 grown by epitaxial growth technique on the buffer layer 42, a n-type InP cap layer 44 grown by epitaxial growth technique on the photo absorption layer 43. A p-type diffusion region 45 is formed in the InP cap layer 44 and a portion of the InGaAs photo absorption layer 43 thereof. A p-type ohmic electrode 46 is formed on the p-type diffusion region 45, and n-type ohmic electrode 47 is formed on the n-type region of the InP cap layer 44.

A concavity 41A shaped by a slope is formed on the bottom principal plane of the InP substrate 41. An incoming photo signal 1 passes through a side face of the InP substrate 41 in parallel to the bottom principal plane, and is reflected toward the photo absorption layer 43 by the slope shaping the concavity 41A. The concavity 41A is covered by a SiN film 41a and an Al reflection film 41b to increase a reflection rate of the concavity 41A. The Al film 41b is protected by a Ti adhesive film 41c and an Au film 41d.

As described above, all PIN photo diodes shown in FIGS. 2–4 increase an optical path length in a photo absorption layer, by making an incoming photo signal pass through the photo absorption layer at an inclined angle by refraction or reflection of the incoming photo signal. In these conventional configurations, however, effective efficiency depends on a polarization of the incoming photo signal due to polarization dependency of the refraction or the reflection. Polarization of photo signals propagating through an optical fiber rotates at random. The photo detecting efficiency changes every moment, and the change causes a problem in an optical fiber communication system.

The slope which refracts or reflects the incoming photo signal in the conventional PIN photo diodes described above is formed as a portion of a semiconductor layer occupying a limited region. An incidence of the incoming photo signal must be controlled precisely. Especially, in the case that the p-type ohmic electrode is formed on the photo absorption layer, the positional relationship between the photo absorption layer and the slope must be controlled precisely, and the control makes a manufacturing of the photo diode complicated.

Furthermore, in case of the conventional PIN photo diodes previously described, the slope which is inclined to the principal plane of the substrate is formed by a selective etching process or a dicing process. It is difficult to form an optically flat plane by the selective etching and the dicing. A diffusion loss may be caused by the refraction or the reflection.

SUMMARY OF THE INVENTION

Accordingly, it is a general object of the present invention to provide a novel and useful semiconductor photo detecting device in which one or more of the problems described above are eliminated.

Another and more specific object of the present invention is to provide a high speed semiconductor photo detecting device with a low optical loss which does not require a complicated manufacturing processes, and to provide a method for making the same.

In order to achieve the above objects according to the present invention, a semiconductor photo detecting device, includes a semiconductor substrate having a flat side face, and a photo absorption layer formed on said semiconductor substrate, wherein an entire part of said flat side face is inclined to a line perpendicular to a principal plane of said semiconductor substrate, and said flat side face is substantially perpendicular to an incoming photo signal.

At least one side face of the semiconductor substrate entirely is inclined to the principal plane of the semiconductor substrate. By using the entire side face as an incidental face of an incoming photo signal, the incoming photo signal arrives substantially straight at the photo absorption layer formed on the substrate without refraction or reflection. Because the entire side face of the semiconductor substrate is used as the incidental face of the incoming photo signal, the incoming photo signal goes straight to the photo absorption region, and therefore, a position of the photo detection region need not be controlled precisely. Manufacturing process of the semiconductor photo detecting device is simplified. By using an inclined substrate as the semiconductor substrate, the flat side face is easily achieved by simple cleavage operation. It is easy to obtain a side face with sufficient optical quality. Since the incoming photo signal passes through the incidental face perpendicularly, the problem of polarization dependency caused by a refraction or reflection is also eliminated.

Other objects, features, and advantages of the present invention will be more apparent from the following detailed description when read in conjunction with the accompanying drawings.

DETAIL DESCRIPTION OF THE PREFERRED EMBODIMENTS

<First Embodiment>

Figure 5:
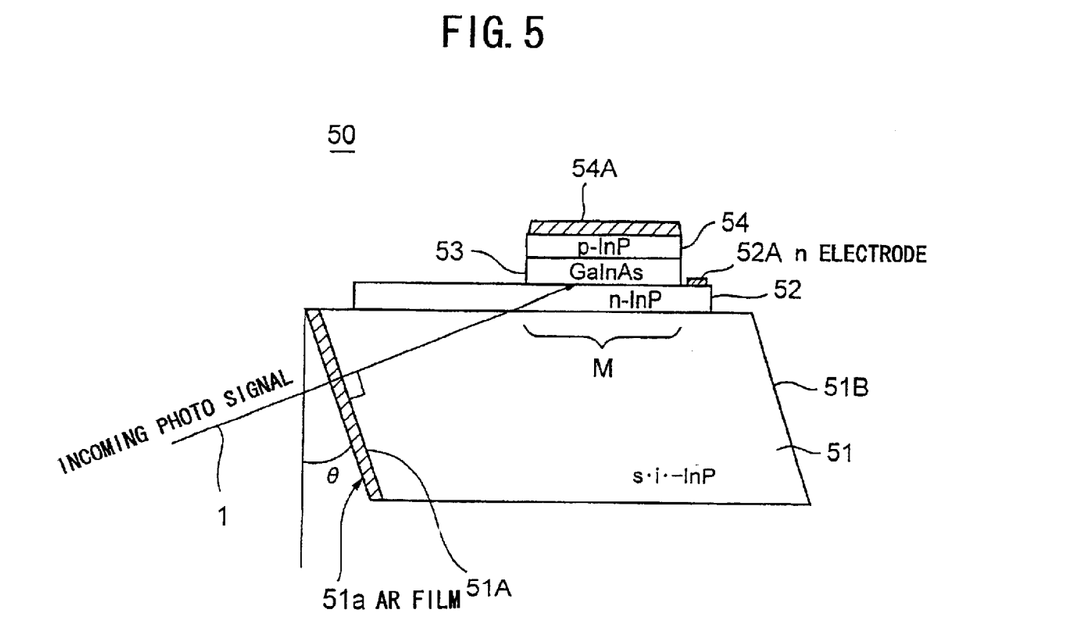
FIG. 5 is a drawing showing a configuration of a PIN photo diode as the first embodiment of the present invention.

FIG. 5 shows a configuration of a PIN photo diode 50 of the first embodiment of the present invention.

As shown in FIG. 5, the PIN photo diode 50 is formed on a semi-insulating inclined InP substrate 51, and includes a 0.5 μm thick n-type InP buffer layer 52 grown by an epitaxial growth technique on the substrate 51, a 0.5 μm thick non-doped or n⁻-type InGaAs photo absorption layer 53 grown by an epitaxial growth technique on the n-type buffer layer 52, and a 0.5 μm thick p-type InP cap layer 54 grown by an epitaxial growth technique on the photo absorption layer 53. The InGaAs photo absorption layer 53 and the p-type InP cap layer 54 form a photo detection region M of a round mesa structure of 10 μm diameter on the n-type InP buffer layer 52. An n-type ohmic electrode 52A is formed on the n-type InP buffer layer 52, and p-type ohmic electrode 54A on the p-type InP cap layer 54.

In case of the PIN photo diode 50 as the first embodiment of the present invention, the semi-insulating InP substrate 51 has a principal plane inclined to a (100) plane at an angle θ of 30° or less, and further has a couple of side faces 51A and 51B, which is (110) plane, parallel to each other. The side faces 51A and 51B is inclined at an angle θ of 30° or less to the line perpendicular to substrate principal plane.

It is preferred that the side faces 51A and 51B are formed as a cleavage plane. The side face 51A is covered by an anti-reflection film 51a such as SiN.

In case of the PIN photo diode 50 illustrated in FIG. 5, an incoming photo signal comes to the side face 51A perpendicularly, and passes through the InP substrate 51 without a refraction. The photo signal comes to the InGaAs photo absorption layer at an inclined angle. Because of this inclination, even if the photo absorption layer is thin, an optical path of the incoming photo signal in the photo absorption layer 53 is long enough for the photo absorption layer 53 to absorb the photo signal efficiently. The incoming photo signal may be refracted at a boundary face between the semi-insulating InP substrate 51 and n-type InP buffer layer 52 due to a carrier density difference. The refraction rate may depend on a polarization of the incoming photo signal, but a polarization dependency of a refraction rate is small. A boundary face between the InP substrate 51 and the InP buffer layer 52 is so close to the photo absorption layer 53 that the refracted incoming photo signal does not incline off the photo absorption layer 53.

Optical excitation carriers excited by an absorption of the incoming photo signal in the photo absorption layer 53 flow to the electrodes 52A and 54A in response to a reverse bias voltage between the electrodes 52A and 54A, i.e., an electric current flows between the electrodes 52A and 54A.

In this embodiment, the smaller the substrate inclined angle θ is, the longer the optical path of the incoming photo signal in the photo absorption layer 53. On the other hand, if the angle θ is reduced, the area of a photo detection unit, that is, the photo absorption layer 53 and the InP cap layer 54 on the photo detection layer 53, and the area of the ohmic electrode 54A need to be increased. The increase impedes a high speed response of the photo diode. Consequently, it is preferred that the angle θ is 20° or more. On the other hand, if the angle θ is increased, a sharp edge of the InP substrate 51 becomes physically weak. It is also preferable that the angle θ is kept 30° or less.

A manufacturing process of the PIN photo diode shown in FIG. 5 will be described with reference to FIGS. 6A–6D.

Figure 6A:
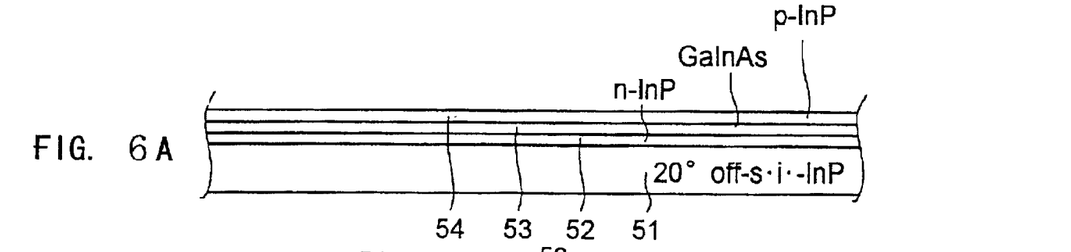
FIG. 6A is a drawing showing the first manufacturing process of the PIN photo diode illustrated in FIG. 5.

As shown in FIG. 6A, the PIN photo diode 50 is formed on an inclined InP substrate 51 having an inclination angle θ of about 20°. An n-type InP buffer layer 52, a non-doped or n⁻-type InGaAs photo absorption layer 53, and p-type InP cap layer 54 are made on the inclined InP substrate 51 grown by a epitaxial growth technique of MOVPE method. As shown in a manufacturing process illustrated in next FIG. 6B, a PIN photo diode shown in FIG. 5 is formed, by patterning the semiconductor layers 52–54, at each device section made on the InP substrate 51.

Figure 6B:
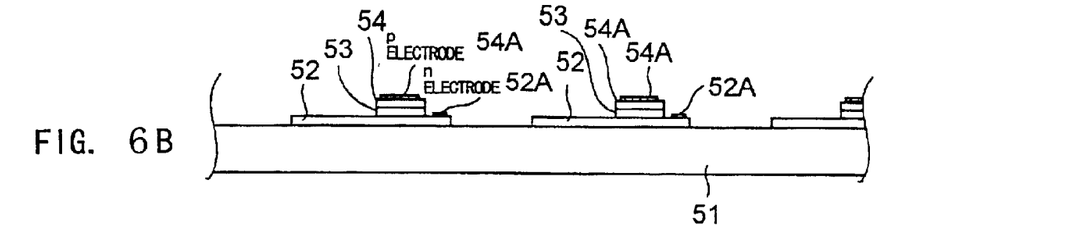
FIG. 6B is a drawing showing the second manufacturing process of the PIN photo diode illustrated in FIG. 5.

In the manufacturing process shown in FIG. 6B, a process up to forming the electrodes 52A and 54A is performed. In a next manufacturing process shown in FIG. 6C, the inclined InP substrate 51 is cleaved by operating a cutter on a support face. As a consequence, the InP substrate 51 is divided into chips having a couple of (110) cleavage face 51A and 51B. In a manufacturing process shown in FIG. 6D, after an anti-reflection film 51a is formed on the cleavage face 51A, the PIN photo diode 50 shown in FIG. 5 is completed.

Figure 6C:
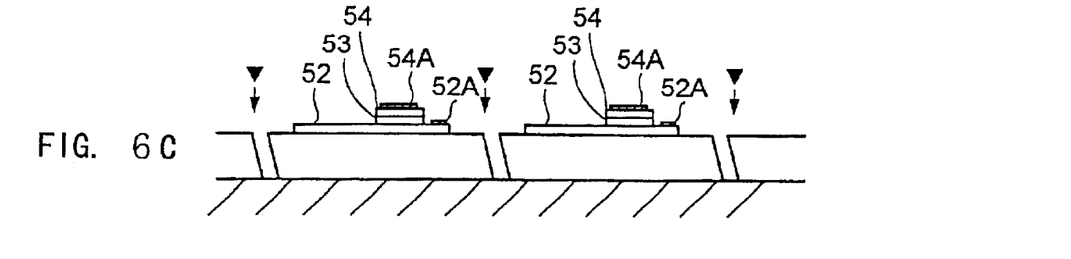
FIG. 6C is a drawing showing the third manufacturing process of the PIN photo diode illustrated in FIG. 5.
Figure 6D:
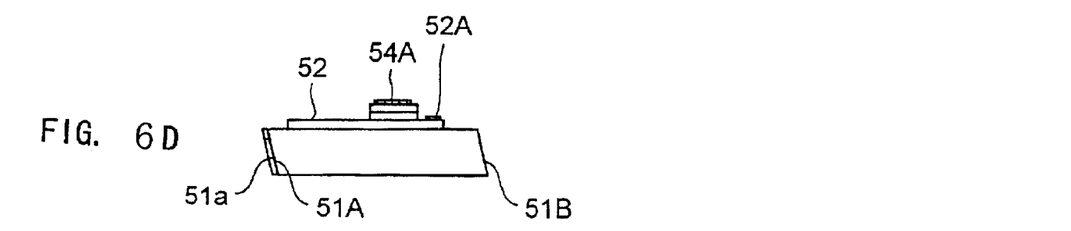
FIG. 6D is a drawing showing the fourth manufacturing process of the PIN photo diode illustrated in FIG. 5.

In the cleavage process shown in FIG. 6C, a (111) cleavage face may appear instead of a (110) cleavage face.

In case of the PIN photo diode 50 as an embodiment of the present invention, the cleavage face 51A of the InP substrate 51 is an optical incidental face. Making a good optical incidental face is easy and certain. Since the optical incidental face is made by a cleavage, whole side face of the InP substrate 51 can be used as the optical incidental face. It is not necessary to precisely control a positional relationship between the optical incidental face 51A and the photo detection region M because the incoming photo signal certainly goes to the photo detection region M.

<Second Embodiment>

Figure 7:
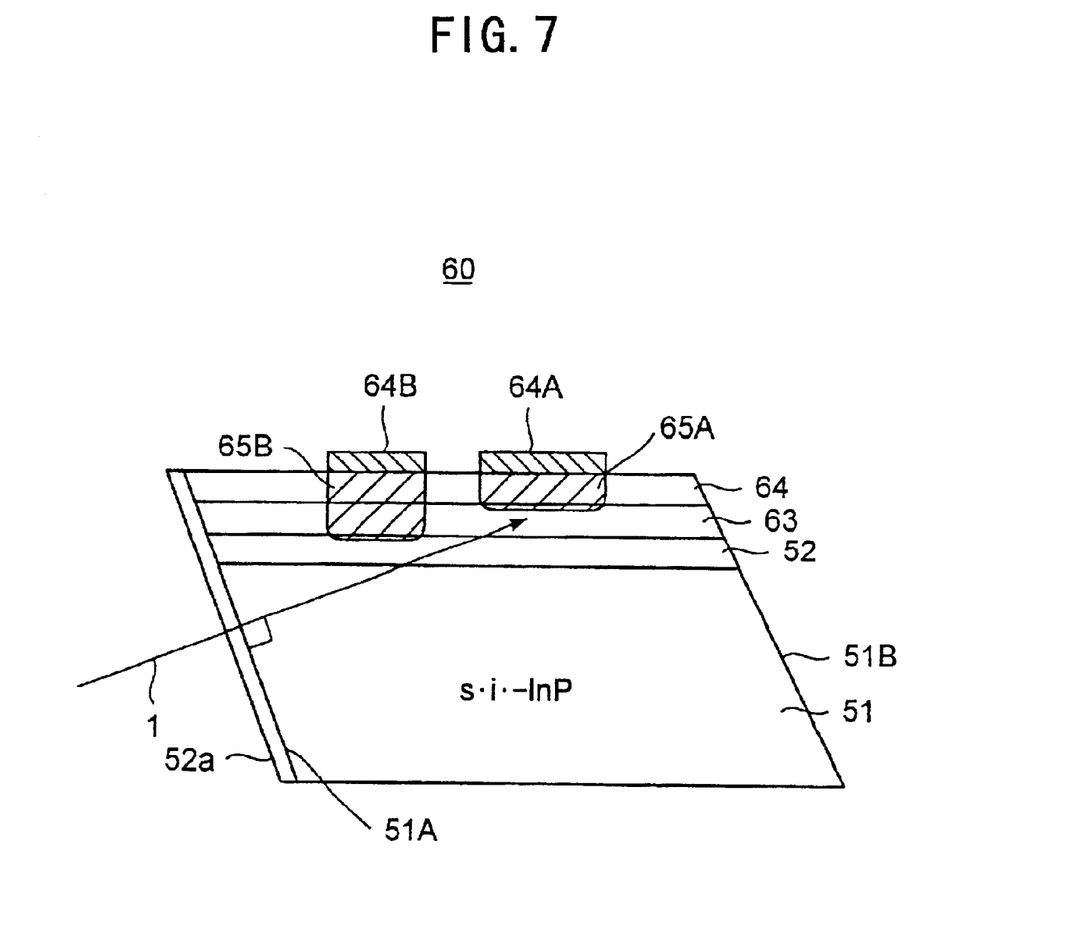
FIG. 7 is a drawing showing a configuration as the second embodiment of the present invention.

FIG. 7 shows a configuration of a PIN photo diode 60 as the second embodiment of the present invention. The units previously described are referred by the same numerals, and a description of the units is omitted.

As shown in FIG. 7, the second embodiment uses an n-type InGaAs photo absorption layer 63 and an n-type InP cap layer 64 instead of the non-doped InGaAs photo absorption layer 53 and p-type InP cap layer 54. The n-type InP layer 52, n-type InGaAs photo absorption layer 63, and n-type InP cap layer 64 are cleaved as well as the InP substrate 51. In other words, the cleavage faces 51A and 51B are side faces of a multilayer structured body consisting of the InP layer 52, the InGaAs layer 63, and the cap layer 64.

A p-type diffusion region 65A is formed in a portion of the n-type InP cap layer 64 and a portion of the photo absorption layer 63 under the n-type InP cap layer 64. A p-type ohmic electrode 64A is formed on the p-type diffusion region 65. An n-type diffusion region 65B reaching to the n-type InP layer 52 is formed in the other region, and an n-type electrode 64B is formed on the n-type diffusion region 65B. An anti-reflection film 52a is made on the cleavage face 51A. In this configuration, a bias voltage is applied between the electrode 64A and 64B to generate a reverse bias in the photo absorption layer 63 through the InP layer 52.

In this configuration, an optical incidental angle to the cleavage face 51A is perpendicular. The incoming photo signal passes straight through the InP substrate 51, and arrives at the photo absorption layer 63. Like the first embodiment in FIG. 5, the second embodiment eliminates a problem of a polarization dependency caused by a semiconductor photo detecting device. Since the whole side face of the substrate 51 is a cleavage face 51A, the positional relationship between the incoming side face 51A and the photo detection region consisting of the p-type diffusion region 65A is not severely constrained, and a manufacturing of the device becomes easy. Moreover, because the incoming side face 51A is a cleavage face, forming a good optical incidental face is easy, and cause less optical loss.

In the embodiments described above, an InP substrate is used as an example. It should be noted that other III–V group compound semiconductor than InP can be used as a substrate.

The present invention is not limited to these embodiments, but various variations and modifications may be made without departing from the scope of the present invention.

This patent application is based on Japanese priority patent application No. 2000-402075 filed on Dec. 28, 2000, the entire contents of which are hereby incorporated by reference.

What is claimed is:

1. A semiconductor photo detecting device, comprising:

a semiconductor substrate having a flat side face; and a photo absorption layer formed on said semiconductor substrate, wherein an entire part of said flat side face is inclined to a line perpendicular to a principal plane of said semiconductor substrate;

wherein said flat side face is substantially perpendicular to an incoming photo signal, wherein said flat side face is a cleavage face of said semiconductor substrate, and wherein said semiconductor substrate has another side face parallel to said flat side face.

2. The semiconductor photo detecting device as claimed in claim 1, wherein said semiconductor substrate is a III-V group compound semiconductor substrate, and said flat side face is one of a (110) plane and a (111) plane.

3. The semiconductor photo detecting device as claimed in claim 2, wherein said principal plane of said semiconductor substrate is inclined to a (100) plane.

4. The semiconductor photo detecting device as claimed in claim 1, wherein said flat side face is inclined to a line perpendicular to said principal plane at an angle of 30° or less.

5. The semiconductor photo detecting device as claimed in claim 1, wherein said side face is covered by an anti-reflection film.

6. The semiconductor photo detecting device as claimed in claim 1, wherein said photo absorption layer is formed in a range in which a perpendicular line to said flat side face crosses.

7. The semiconductor photo detecting device as claimed in claim 1, further comprising, a first cap layer formed on said photo absorption layer; and an ohmic electrode formed on said cap layer.

8. The semiconductor photo detecting device as claimed in claim 1, further comprising:

a cap layer formed on said photo absorption layer; and a second conduction type region formed in a part of said photo absorption layer and said cap layer, wherein said photo absorption layer and said cap layer are a first conduction type; and said photo absorption layer is formed in a range in which a perpendicular line to said flat side face crosses.

* * * * *